United States Patent
Meyer et al.

(12) 
(10) Patent No.: US 6,221,440 B1
(45) Date of Patent: *Apr. 24, 2001

(54) PROCESS FOR PLATING METAL COATING

(75) Inventors: Heinrich Meyer, Berlin; Ralf Schulz, Hohen, both of (DE)

(73) Assignee: Atotech Deutschland GmbH, Berlin (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/817,337

(22) PCT Filed: Oct. 18, 1995

(86) PCT No.: PCT/DE95/01501

§ 371 Date: Apr. 2, 1997

§ 102(e) Date: Apr. 2, 1997

(87) PCT Pub. No.: WO96/12051

PCT Pub. Date: Apr. 25, 1996

(30) Foreign Application Priority Data

| Oct. 18, 1994 | (DE) | ................................................ | 44 38 791 |
| Oct. 18, 1994 | (DE) | ................................................ | 44 38 777 |
| Oct. 9, 1995 | (DE) | ................................................ | 195 38 531 |

(51) Int. Cl.$^7$ ........................................ H05H 1/00
(52) U.S. Cl. ...................... 427/537; 427/576; 427/98; 427/96; 427/226
(58) Field of Search .................... 427/96, 98, 226, 427/536, 576, 537

(56) References Cited

U.S. PATENT DOCUMENTS

| 4,717,587 | * | 1/1988 | Suhr et al. | ............................. 427/39 |
| 4,965,090 | * | 10/1990 | Gartner et al. | .......................... 427/39 |
| 5,019,415 | | 5/1991 | Oehr et al. . | |
| 5,561,082 | * | 10/1996 | Matsuo et al. | ....................... 437/187 |

FOREIGN PATENT DOCUMENTS

| 681758A5 | 5/1993 | (CH) . |
| 3510982 | 3/1985 | (DE) . |
| 3828211 | 3/1985 | (DE) . |
| 3716235 | 11/1988 | (DE) . |
| 3744062 | 7/1989 | (DE) . |
| 3806587 | 9/1989 | (DE) . |
| 4316679 | 7/1994 | (DE) . |
| 0321734 | 6/1989 | (EP) . |
| 0329845 | 8/1989 | (EP) . |
| 93/26143 | 12/1993 | (WO) . |

OTHER PUBLICATIONS

Suhr et al., Thin Palladium Films Prepared by Metal–Organic Plasma–Enhanced Chemical Vapour Deposition, Thin Solid Films, vol. 157, pp81–86, 1988.*

Einfuhrung in die Leiterplattentechnologie, pp. 95–97.

Thin Palladium Films Prepared by Metal–Organic Plasma–Enhanced Chemical Vapour Deposition, E. Feurer and H. Suhr, Dept. of Organic Chemistry, University of Tubingen, Thin Solid Films, 157 (1988) pp. 81–86, Preparation and Characterization.

* cited by examiner

*Primary Examiner*—Brian K. Talbot
(74) *Attorney, Agent, or Firm*—Paul & Paul

(57) ABSTRACT

A process for depositing metal coatings on polyimide surfaces for producing conductor tracks includes depositing a first metal coating by decomposition of volatile metal compounds by a glow discharge in a gas mixture containing inert gases and oxygen containing compounds, followed by electroless deposition of a second metal coating from an acid or neutral metallizing bath.

10 Claims, No Drawings

PROCESS FOR PLATING METAL COATING

BACKGROUND OF THE INVENTION

1. Field of the Invention

The invention relates to a process for depositing metal coatings on polyimide surfaces, and to a process for producing an electrical circuit base, which may be made by using said process.

2. Description of the Related Art

Polyimide is used in the electronics industry as a substrate material for producing printed circuit boards, hybrid circuits, semi-conductor carriers (chip carriers, multi-chip modules) and other components. This material has advantages compared to previous material such for example as epoxy resins.

For example its thermal resistance is higher, so that the longitudinal expansion of the material under thermal stress is less than with previous materials. Polyimide substrates also have better electrical insulating values.

For use as a substrate material in semi-conductor carriers, semi-finished products of the polyimide can be applied to an appropriate carrier by a spin-coating process in a thin layer and subsequently converted to polyimide. It is possible in a simple and reproducible way to etch micro-fine holes in the coatings thus formed, these holes serving to connect a plurality of metallization planes.

Polyimide films lined with copper films are usually used in the production of polyimide laminates, for example for the manufacture of printed circuit boards. The conductor tracks are usually produced from the copper coatings by etching processes. For this purpose process techniques are used which have been described at many points in the literature (for example in Handbuch der Leiterplattentechnik,ed.:. G. Herrmann, Vol. 2, Eugen C. Leuze Verlag, Saulgau 1991). Such processes are basically suitable for the manufacture of printed circuit boards, yet the width of the finest conductor tracks which may be reproducibly manufactured by such techniques lies in a range of roughly 75–100 $\mu$m.

The copper films are connected in a previously known way by adhesion with the polyimide surfaces. However, the adhesive coating softens under thermal stress, for example when the printed circuit boards are soldered, and is also insufficiently resistant to the chemical baths used for metallizing holes in polyimide laminates.

In order to avoid the adhesive coatings, there was developed the "cast-on" technique well known to the person skilled in the art, for manufacturing adhesive-free polyimide laminates, in which liquid polyamide acid solution is poured on to a copper film before dehydration and cyclisation to form the polyimide. After formation of the polyimide on the copper film, there results in this way a securely adhering polymer/metal bond. This process also has the disadvantage that only relatively thick copper films, for example 17 $\mu$m thick, can be used. In addition, this material is extremely expensive, for example the commercial product Espanex® of Nippon Steel Chemical Co. Ltd., Tokyo.

Polyimide laminates coated with thin copper films were in fact manufactured. However the outlay for manufacturing these laminates is extraordinarily high, so that the material costs are also considerable. Handling of the laminates coated with thin copper films is also problematic, as the copper films are extremely sensitive to mechanical influences. In the case of the "cast-on" technique, such thin copper films cannot be used, as the laminate would be severely distorted, among other things, during manufacture.

Finer conductor tracks may however still be produced, when no laminates provided with copper films on the surface are used as initial materials. In this case the conductor tracks are formed directly on the surfaces by metal coating. Adhesive-free polyimide substrates produced by sputtering or metal evaporation or by means of chemical methods have not for some time become established in the manufacture of printed circuit boards. For example, it is necessary in order to produce a sufficient adhesion of the metal coatings on polyimide first to apply a thin chromium layer, upon which the copper coatings are then deposited, for example pre-drilled material in a grid pattern of the company Sheldahl. However, chromium gives rise to problems in etching, so for example an additional etching process is necessary, for which reason the use of chromium coatings is avoided where possible. From a technical standpoint it would therefore be extremely desirable to manufacture circuit bases from uncoated polyimide material. It has not in practice yet been possible to realise this technically. The following are the reasons for this:

Particularly when chemical metal coating methods are used, the disadvantage emerges of the greater water capacity of polyimide compared to other polymers. It has for example become apparent that the adhesion of copper coatings deposited in an electroless and electrolytic manner on the entire surface of polyimide films on the polyimide surface, is considerably reduced under thermal stress, for example during soldering, or is in fact entirely removed. In order to avoid the occurrence of bubble-shaped raised portions in thermal treatment, it is generally proposed to anneal the coated polyimide films after coating. The annealing treatment alone however is insufficient to prevent the occurrence of bubbles, when polyimide films provided on the entire surface with copper coatings on both sides are exposed to thermal treatment. In this case the enclosed moisture originating from the chemical metallizing process can no longer escape during the annealing treatment, so that water emerges explosively from the polyimide film during thermal treatment and detaches the copper coating from the polyimide surface.

For the abovenamed reasons, other processes for securely adhesive metallizing of polyimide substrates have been developed. Due to the requirements to obtain sufficiently secure adhesion of the deposited metal coatings both during and after thermal stress on the substrates, vacuum processes for metallizing have been used. Metal coating by the decomposition of volatile metal compounds by means of glow discharge represents a superior procedure in this respect. In DE 35 10 982 A1 there is disclosed such a process for manufacturing electrically conductive structures on non-conductors, for example polyimide films by the deposition of metallic films on the non-conducting surfaces by decomposition of organometallic compounds in a glow discharge zone. The deposited metal films preferably serve as catalytically active nucleus layers for the subsequent electroless metallization of the surfaces.

There is also described in DE 38 06 587 A1 a process for manufacturing metallic structures on polyimide by means of the decomposition of organometallic compounds in a glow discharge.

Further metallizing processes by means of glow discharge and organometallic compounds are disclosed in the documents DE 37 16 235 A1, DE 37 44 062 A and DE 38 28 211 C2.

In order to reduce the purest possible metal coatings by the glow discharge method, i.e. metal coatings without any appreciable admixtures of carbon and oxygen, it is proposed to heat the substrate up to the highest possible temperature during the metal deposition. The carbon-containing admixtures originate from the organic components of the volatile organometallic compounds usually used in deposition. The influence of the substrate temperature on the carbon content of the metal coatings deposited by the glow discharge method is for example disclosed in E. Feurer and H. Suhr, "Thin palladium films prepared by metal-organic plasma-enhanced chemical vapour deposition", Thin Solid Films 157 (1988), pages 81, 84. According to this, the carbon content reduces as the substrate temperature rises. It can also be seen from this document that the palladium coatings contain scarcely 30% by weight of carbon at ambient temperature.

If the metal coating contains an excessive carbon content due to insufficient decomposition of the metal compounds in the glow discharge, or due to insufficient desorption of the only partially decomposed ligand compounds from the substrate surfaces, the conductivity of the deposited metal coatings is relatively low and in addition its catalytic activity is insufficient to start an electroless metal deposition on the surfaces, so that metal coatings slightly contaminated with oxides are formed in an electroless manner, or deposition is totally absent.

Heating of the substrate is undesirable for many applications. Therefore attempts were made to reduce the carbon content of the metal coatings in another way. For example, in the above named publication by E. Feurer and H. Suhr it is proposed to provide post-treatment of the deposited metal coatings with an oxygen plasma. According to experiments by these authors, a further alternative resides in replacing the argon, which is conventionally used as a carrier gas in metal coating, totally by oxygen. Thus instead of palladium, palladium oxide is deposited, which can again be reduced to form metallic palladium by means of a subsequent treatment in a hydrogen plasma. This procedure is however extremely complicated and expensive. Moreover, the organometallic compounds already decompose when the oxygen is passed through the supply container containing these compounds, so that only a small proportion reaches the glow discharge zone.

It is in fact possible to produce secure adhering metal coatings on polyimide surfaces by the metal deposition process by means of a glow discharge process, if further metal coatings from electroless and electrolytic metallising baths are deposited on this metal coating. It has however become apparent that sufficiently secure adhesion of the deposited metal coatings on the polyimide surface does not occur if the coated substrate comes into contact with aqueous-alkaline solutions after the necessary annealing treatment and before or during the test for determining the adhesion. Considered as aqueous-alkaline solutions for example are the developer and strip solutions in the structuring processes with photoresists, in order to form conductor structures from the metal coatings deposited on the entire surface. Subsequent annealing treatment cannot reverse the reduction in adhesion caused by contact with the aqueous-alkaline solution.

Thus the problem underlying the present invention is to avoid the disadvantages of prior art and to find a process by means of which extremely pure metal coatings may be deposited in an electroless manner on polyimide surfaces, in order to produce micro-fine conductor track structures, the adhesion of the metal coatings on the surfaces not being impaired by contact after deposition with aqueous-alkaline solutions, and a process by means of which also micro-fine conductor track structures securely adhering to the polyimide surfaces can be produced in order to manufacture electrical circuit bases with polyimide surfaces.

SUMMARY OF THE INVENTION

This problem is solved by claim 1. Preferred embodiments are given in the sub-claims.

Metal coatings preserving such adhesion on substrates with polyimide surfaces can be produced in a process with the following essential process steps:

a) deposition of a first low-carbon and low-oxygen metal coating on the polyimide surfaces by decomposition of volatile metal compounds by means of a glow discharge process in the presence of a gas mixture containing inert gases and oxygen or oxygen-containing compounds, b) electroless deposition of a second metal coating on the first metal coating, from a metallising bath which is set to an acidic or neutral level.

DETAILED DESCRIPTION

The first metal coating deposited by glow discharge has unusual properties: when appropriate deposition parameters are selected, it is smooth and brilliant. By friction on the surface of these coatings, however, a proportion of the metal film may easily be removed. This proportion of the coating has a lower adhesion with respect to the substrate material. By means of highly-resolved electron microscopy (scanning electron microscopy, transmission electron microscopy) it was discovered that the deposited coating has a relatively compact structure of spherical particles which clearly have only restricted bond strength to one another.

By means of depositing the first metal coating in a gas atmosphere containing the oxygen-containing compounds, and deposition of the second metal coating from an acidic or neutral electroless metallizing solution, this upper looser proportion of the first metal coating can be consolidated. In this way an adhesive bond is produced between the metal coatings and the polyimide surface, which is no longer impaired even upon contact with aqueous-alkaline solutions. In addition, the polyimide metallized in this manner absorbs considerably less moisture during the chemical deposition than in known processes, so that after the treatment, fewer hydroxyl ions remain behind in the material, which could weaken the adhesive bond by hydrolysis particularly when the substrate is subject to thermal stress.

In the manufacture of micro-fine conductor tracks, special demands are made on the secure adhesion of the conductor tracks on the laminate surface. This is due to the fact that adhesion on the laminate surface can only be achieved over an extremely small contact surface of the conductor tracks. Therefore the degree of adhesion in this case must be extremely high under various operating conditions. Treatment with corrosive solutions or gaseous materials, which attack this bond from the side, can for example easily lead to a situation in which the underside edges of the conductor tracks lift off in a wedge configuration from the laminate surface. Contrary to wide conductor tracks, such wedge shaped delaminations have a more severe effect on the adhesion of fine conductor tracks than on the wider conductor tracks.

By forming the first metal coating by means of a glow discharge process in the presence of oxygen or oxygen-containing compounds, catalytically highly-active metal coatings can be obtained, so that extremely pure metal coatings may be deposited in an electroless manner thereon. Oxygen ($O_2$) is preferably used as an oxygen-containing compound. Instead of oxygen, however, nitrogen oxides ($N_2O/NO_x$) can be used, which during the glow discharge form at least intermediately atomic oxygen as well as the inert gas nitrogen.

In addition to the volatile metal compounds and the oxygen-containing compounds, the oxidising gas mixture also contains inert gases, for example nitrogen or rare gases. For reasons of cost, argon is usually used as a rare gas.

Due to the oxidation capacity of the oxygen-containing compounds in the gas mixture on metal deposition, the substrate surfaces, after any cleaning and functionalising of the surfaces, are also further cleaned during metal deposition, in this case of the organic fragments of the organometallic compounds arising due to glow discharge, so that increased adhesion of the metal coatings is rendered possible. By using a gas mixture which in addition contains inert carrier gases, the formation of metal oxide layers can also be extensively prevented, as their electrical conductivity and catalytic activity would not be sufficiently high for electroless metal coating. Also, the organometallic compounds are prevented from decomposing before their introduction into the glow discharge zone, as pure oxygen is not used as carrier gases for the compounds, but a gas mixture with the inert gases, which is passed over the normally liquid metal compounds.

In a particularly suitable gas mixture forming extensively carbon-free and oxygen-free metal coatings, the ratio of the partial pressure of the oxygen-containing compounds to that of the inert gases in the gas mixture is set to a value of between 2:1 and 1:8, preferably between 1:3 and 1:4. Assuming that the ligands in the organometallic compounds are oxidized by oxygen to form carbon dioxide and water, when a partial pressure ratio of 1:3 to 1:4 is set, a value lying beneath the theoretical (stoichiometric) consumption of oxygen is set. For example, when setting the ratio of 1:3 during the evaporation of π-allyl-π-cyclopentadienyl-palladium (II) at 45° C., about 15% to 75. of the stoichiometric quantity of oxygen is consumed for total oxidation of the ligands in the compound. Surprisingly, despite the relatively high oxygen content in the gas mixture, low-oxygen metal coatings are produced. This is ascribed to the mentioned oxidation of the ligands and the oxygen consumption of this reaction.

The overall pressure of the gas mixture in the reaction vessel, in which decomposition of the metal compounds takes place, preferably lies between 1 Pa and 50 Pa.

Compounds known in prior art, for example palladium, copper, gold or platinum compounds or their mixtures are used as volatile metal compounds. Other metal compounds are likewise also basically usable, when the metal coating formed is catalytic for the subsequent electroless metallization. The following compounds have proved particularly suitable, particularly dimethyl-π-cyclopentadienyl-platinum, dimethyl-gold-acetylacetonate and in particular π-allyl-π-cyclopentadienyl-palladium (II). The coating conditions indicated in the documents already mentioned may be correspondingly transferred to production of the metal coatings according to the process according to the invention.

Palladium has proved particularly advantageous as it may be easily removed by etching, and thereupon a further metal coating may be deposited in an electroless manner from a copper bath without difficulty. If metals other than palladium, which are not catalytically active, are used in order to deposit the first metal coating, the substrate is dipped in an activating solution, for example a palladium chloride solution, before the electroless metallization.

By producing a thin layer of palladium, there results for the subsequent electroless metal deposition catalytically-acting metal coatings, so that further activation of these metal coatings, for example with solutions containing noble metals, is not necessary. By means of the process according to the invention low-carbon and low-oxygen metal coatings are formed by the glow discharge process in one process step. No further treatment, for example in a glow discharge in the presence of reducing gases such as hydrogen, is necessary.

Layers with a thickness of preferably 0.01 μm to 0.1 μm are preferably deposited. When thinner layers are deposited, the chemical attack of the chemical solutions of subsequent treatment steps on the polyimide surfaces is reinforced, so that sufficient adhesion can no longer be achieved. Deposition of excessively thick metal coatings entails no advantages. In addition to long process times and high costs, problems can arise particularly in the formation of microfine conductor track structures. In addition, thicker palladium layers in particular are difficult to etch.

If during metal coating by means of glow discharge metal coats with sufficiently high electrical conductivity for directly subsequent electrolytic metallizing are formed, it is also possible to use other metal compounds for depositing the first metal coat, for example molybdenum compounds.

Metallizing baths with a pH value between 2 and 8, preferably between 2 and 7, have proved most favourable for electroless metallisation. In particular baths of nickel, copper, cobalt, palladium or their alloys are considered in this respect.

Particularly suitable as a second metal coating is a nickel-boron alloy coating, as this can easily be etched in order to produce the metal structures from the metal. coating over the entire surface.

In another preferred embodiment, an extremely thin palladium layer or a nickel/phosphorus alloy layer with a phosphorus content between 3 and 5% by weight of phosphorus is deposited in an electroless manner as a second metal coating.

In order to produce highly-integrated electrical circuit bases with extremely fine conductor track structures, microfine holes must first be formed in the non- conductive substrates with polyimide surfaces, usually in the form of a laminate. For this purpose a process is preferably used with the following essential process steps:

a) application of a metal coating to at least one substrate surface, for example by deposition of a metal coating, for example of aluminium, as a temporary etching mask, for example by evaporation, b) structuring of the metal coating with a photo-masking technique by means of the following process steps:

ba) covering the metal coating of the photo-mask, preferably with a liquid positive photoresist, bb) exposure and development of the photo-mask, the photo- mask during development being removed from these areas in which holes are provided in the substrate, bc) etching of the holes in the metal coating c) etching of the holes in the substrate and d) removal of the metal coating The photo-masking layer is again removed from a substrate before process step c) or between process steps c) and d).

It has proved that, when using thin aluminium layers and a plasma etching mask, etching of the holes in the metal coating can be effected simultaneously during development of the photoresist. The use of thinly applied liquid resists enables simultaneous stripping of this resist during plasma etching as a further simplification of the process.

Conductor tracks, preferably with track widths and spacings of less than 100 μm, and metal surfaces on the aperture walls are then formed according to the following process scheme:

e) pre-treatment of the surfaces and aperture walls by means of a glow discharge process with an oxidising gas mixture containing an oxygen-containing compound and if necessary inert gases, f) deposition of a first metal coating by decomposition of volatile metal compounds by means of a glow discharge process in the presence of a gas mixture containing inert gases and oxygen-containing compounds, and of a second metal coating by means of electroless metal deposition from an acidic or neutral metallising solution, and if necessary further metal coatings deposited in an electroless and/or electrolytic manner, g) structuring of individual metal coatings by means of a photo-masking technique, preferably using a positive photoresist layer.

Embodiments of the invention given by way of example are described in the following:

Various materials are considered as polyimide substrates: in addition to polyimide films as such, these may also be used in a laminated layer, compressed together with other carrier materials such for example as FR-4 material (epoxy resin/glass fibres) and copper films. Further, plate-shaped polyimide substrates as well as spin-coating layers can be metallised by the process according to the invention. In this case there is also to be understood by polyimide such material as is produced from dissolved and/or post-hardened polyimide. In addition, polyimides with different chemical structures can be used. In the case of KAPTON H, Trade Mark of the Company DuPont de Nemours, Inc., Wilmington, Del., USA, there is for example known a condensation polymerisation product of pyromellitic acid dianhydride (PMDA) with diaminodiphenylether (DDE). UPILEX Trade Mark of UBE Industries, Tokyo, Japan is on the other hand produced from the condensation product from 3,4,3',4'-biphenyl-tetracarboxylic acid dianhydride (BPDA) with DDE (UPILEX-R), or with p-phenylene-diamine (PPD) (UPILEX-S).

Before deposition of the first metal coating by glow discharge, if necessary holes are stamped, drilled or preferably etched in the polyimide substrate.

The metal coating which is applied in order to produce the etching mask (perforation mask) for producing the holes on the polyimide surfaces, is only applied temporarily to the surfaces, i.e. before production of the conductor tracks it is removed from the polyimide again and does not serve as a basic metal coating for producing the conductor tracks. The metals also suitable for production of conductor tracks can also be deposited. As the etching mask is again removed from the perforated substrate and a new metal coating is deposited in order to form the conductor tracks, any possible impairment of the bond between the etching mask and the substrate surface during etching of the holes cannot have a disadvantageous effect on the secure adhesion of the conductor tracks produced later.

The perforated masks formed in order to produce the holes on the substrate surfaces are produced in a photo-chemical way with photo-masks. By a preferred use of a positive photoresist as a photo-mask, a considerably higher optical resolution and thus finer structures are achieved, as thinner coatings may be produced (5–10 μm thickness) with a photoresist, than for example with dry films (30–50 μm thickness of the photoresist layers), so that the light impinging on the layer during exposure is scattered to a lesser degree. Due to the smaller thickness of the photoresist layers, this also adheres better to the foundation. Further, by using positive resists, a positive image overlay can be used when exposing the resist layer, so that exposure errors have a less severe effect. Electrophoretically depositable resists can also be used.

Thereafter the holes in the substrate are produced in a dry etching process; the glow discharge process has proved particularly favourable. For this purpose the substrate with the perforated masks located thereon is treated in a suitable device with a gas, for example oxygen, preferably with a mixture of oxygen and tetrafluoromethane (CF)

By means of optimising the treatment parameters, e.g. the gas composition, the gas pressure and glow discharge power, treatment temperature and time, sufficiently steep aperture walls result without back-etched undercuttings beneath the perforated mask, so that extremely fine holes can be produced even in thicker substrates.

After formation of the holes, the metallic etching mask is again removed. Thereafter the perforated substrate is cleaned, for example with an aqueous solution containing a wetting agent.

Thereafter the surfaces to be coated can be pre-treated by means of a glow discharge process. For example the surfaces are initially etched, cleaned and/or functionalised with reactive groups, the gases reacting with the chemical groups on the polyimide surface.

For pre-treatment the substrate is introduced into a normal plasma reactor, for example a parallel plate reactor, which is in the form of a tube or tunnel reactor. Glow discharge for pre-treatment may be produced both with direct current or with alternating currents (high frequency in the kHz or MHz range). The surfaces are preferably initially etched in oxygen, an oxygen-containing compound such as a nitrogen oxide ($N_2O/NO_x$), in an oxygen/argon or oxygen/nitrogen mix.

The first metal coating which is also catalytically active and has an adhesion-promoting action, is applied on the surfaces thus pre-treated by decomposition of volatile metal compounds. For this purpose an inert carrier gas is passed through a supply container, which contains the organometallic compounds. In addition the inert gas contains oxygen-containing compounds, preferably oxygen ($O_2$) or nitrogen oxides (NO/NO.:). If for transfer of the vapour of the metal compound from the supply container the oxygen-containing compound is not mixed with the carrier gas, said oxygen-containing compound is introduced separately into the plasma reactor and in this way passes into the glow discharge zone. Furthermore, the flow of the oxidizing carrier gas mixture can be subdivided into two partial flows, which flow on the one hand through the supply container and on the other directly into the plasma reactor. Direct introduction of the vapour of the organometallic compound into the plasma reactor without carrier gas is also possible. The oxidizing gas mixture is then passed directly into the plasma reactor.

The carbon and oxygen content of the metal coatings deposited by glow discharge can be determined for example by means of ESCA (Electron Spectroscopy for Chemical Application). For this purpose the coated substrate is introduced into an ultra-high vacuum chamber and illuminated with x-rays (Al—K— or Mg—$K_\alpha$-line). The uppermost atom layers of the metal coating are energised and ionised by the energy-rich radiation, so that electrons emerge from the material. Their energy is measured, so that an element-specific quantitative analysis of the composition of the metal coating is possible.

Palladium has proved particularly advantageous for coating. In this way there result for the subsequent electroless metal deposition catalytically active metal coatings, so that further activation of these metal coatings, for example with solutions containing noble metals, is usually not necessary.

The conditions for metallizing substantially correspond to those in pre-treatment by means of glow discharge. The pressure in the treatment chamber generally comes to 1 Pa to 50 Pa. Usually a temperature on the substrate close to ambient temperature or slightly above is used, by variation in the electrical power of the glow discharge. Heating of the substrate carrier is also advantageous.

The second metal coating, for example a palladium layer, a nickel/boron alloy layer or a nickel/phosphorus alloy layer, can be applied to this basic metal coating by electroless metallization from an acidic or neutral bath.

However the metals gold and cobalt and their alloys as well as pure nickel or alloys of cobalt can also be considered. For fully-additive build-up of metal, palladium is preferably deposited in an electroless manner, as the metal quality of the weakly-acidic chemically-reductive copper baths known at present is insufficient for all technical requirements.

If palladium is applied as a second metal coating in order to produce the conductor tracks according to a procedure other than additive technique, such for example as the semi-additive process, care must be taken that this palladium layer is only deposited in a low layer thickness. This is necessary as palladium is more difficult to etch than for example a nickel/boron alloy layer, and therefore can only be simply removed from the surfaces when the etching agent can penetrate the layer through pores, and the palladium layer can be raised off from below.

The following aqueous electroless metallizing baths are preferably used for the process according to the invention:

1. Electroless nickel bath with hypophosphite as a reducing agent for producing nickel/phosphorus coatings:

| | |
|---|---|
| Nickel sulphate ($NiSO_4.5\ H_2O$) | 25–30 g/l |
| Sodium hypophosphite | 30 g/l |
| Citric acid | 2 g/l |
| Acetic acid | 5 g/l |
| Aminoacetic acid | 10 g/l |
| Lead as lead acetate | 2 mg/l |
| pH value | 6.2 |
| Temperature | 8–84° C. |

The nickel/phosphorus layer contains about 4% by weight phosphorus.

Instead of nickel salts, cobalt salts can also be used for deposition of cobalt/phosphorus alloy layers or a mixture of nickel with cobalt salts for depositing nickel/cobalt/phosphorus layers.

2. Electroless nickel baths with dimethylaminoborane as a reducing agent for producing nickel/boron layers:

| | | |
|---|---|---|
| 2a. | Nickel sulphate ($NiSO_4.5\ H_2O$) | 25 g/l |
| | Dimethylaminoborane | 4 g/l |
| | Sodium succinate | 25 g/l |
| | Sodium sulphate | 15 g/l |
| | pH value | 5.0 |
| | Temperature | 60° C. |
| 2b. | Nickel sulphate ($NiSO_4.5\ H_2O$) | 40 g/l |
| | Dimethylaminoborane | 1–6 g/l |
| | Sodium citrate | 20 g/l |
| | Lactic acid (85% by weight) | 10 g/l |
| | pH value | 7.0 |
| | Temperature | 40° C. |
| 2c. | Nickel sulphate ($NiSO_4.5\ H_2O$) | 50 g/l |
| | Dimethylaminoborane | 2.5 g/l |
| | Sodium citrate | 25 g/l |
| | Lactic acid (85% by weight) | 25 g/l |
| | Thiodiglycolic acid | 1.5 mg/l |
| | pH value | 6–7 |
| | Temperature | 40° C. |

Baths with nickel chloride or nickel acetate instead of nickel sulphate may also be used. Diethylaminonoborane instead of dimethyaminoborane is also suitable as a reducing agent.

3. Electroless palladium baths with formic acid or its derivate as a reducing agent:

| | | |
|---|---|---|
| 3a. | Palladium acetate | 0.05 Mol/l |
| | Ethylenediamine | 0.1 Mol/l |
| | Sodium formiate | 0.2 Mol/l |
| | Succinic acid | 0.15 Mol/l |
| | pH value (set with formic acid) | 5.5 |
| | Temperature | 67° C. |
| 3b. | Palladium chloride | 0.5 Mol/l |
| | 2-diethylaminoethylamine | 0.6 Mol/l |
| | Methane acid ethyl ester | 0.3 Mol/l |
| | Potassium dihydrogen phosphate | 0.2 Mol/l |
| | pH value (set with formic acid) | 6.0 |
| | Temperature | 70° C. |
| 3c. | Palladium acetate | 0.05 Mol/l |
| | 1,2-bis(3-aminopropylamino)-ethane | 0.1 Mol/l |
| | Sodium formiate | 0.3 Mol/l |
| | pH value (set with formic acid) | 5.9 |
| | Temperature | 59° C. |

4. Electroless copper bath with hypophosphite as a reducing agent:

| | | |
|---|---|---|
| 4a. | Copper chloride ($CuCl_2.2\ H_2O$) | 0.06 Mol/l |
| | N-(hydroxyethyl)-ethylene diamine triacetate trisodium salt | 0.074 Mol/l |
| | sodium dihydrogen hypophosphite ($NaH_2PO_2.H_2O$) | 0.34 Mol/l |
| | pH value | 6 |
| | Temperature | 65° C. |
| 4b. | Copper sulphate ($CuSO_4.5\ H_2O$) | 0.04 Mol/l |
| | N-(hydroxyethyl)-ethylene diamine triacetate trisodium salt | 0.05 Mol/l |
| | sodium dihydrogen hypophosphite ($NaH_2PO_2.H_2O$) | 0.34 Mol/l |
| | pH value | 3 |
| | Temperature | 68° C. |

Apart from the named baths, other types of baths or baths for depositing other metals can be used, if these are acidic or neutral, i.e. have a pH value below about 8, preferably between 2 and 7.

The electroless metallizing baths should have the smallest possible temperature and/or the highest possible deposition speed, as in this way the secure adhesion of the metal coating can be further increased.

Further metal coatings may be precipitated from electroless or electrolytic metallizing baths on the second metal coating. If the second metal coating already has a sufficient layer thickness so that it is free of pores, the metal coatings deposited thereon may also be produced with alkaline metallizing baths. All depositable metals can be considered here. The conventional electroless and electrolytic baths are used.

The substrates are brought into contact with the aqueous treatment baths, for example during electroless or electrolytic metallizing, by dipping in the treatment solutions, but also in so-called horizontal treatment systems, in which the treatment solutions are applied to the substrates by splashing.

The invention is further explained in the following examples:

The following conditions were observed in all examples: reactor type: parallel plate reactor, high-frequency voltage on the substrate electrode, frequency: 13.56 MHz, substrate temperature 35° C.:

EXAMPLE 1

(Deposition of Palladium on Kapton H Film):
1. Pre-treatment by means of glow discharge:
   Gas: oxygen
   Pressure: 25 Pa
   Gas flow: 100 standard-$cm^3$/min,
   Power density: 0.8W/$cm^2$
   Treatment time: 90 seconds
2. Pd deposition by means of glow discharge:
   Organometallic compound: π-allyl-π-cyclopentadienyl-palladium-(II),
   Gas: Ar/$O_2$ in a mixture of 3:1 (volume ratio)
   Pressure: 10 Pa
   Gas flow: 25 standard-$cm^3$/min
   Power density: 0.5W/$cm^2$
   Evaporator Temperature: 45° C.

300 mg (Δ 1.4 mMol) of organic metallic compounds were evaporated and transferred into the reactor. In this case in total 60 standard-$cm^3$ oxygen were consumed in the argon/oxygen mixture. In a further experiment 240 standard-$cm^3$ oxygen were consumed. In both cases largely carbon-free palladium layers were obtained. Assuming that the ligands of the organometallic compound are oxidized by oxygen to form carbon dioxide and water, in the present case 330 standard-$cm^3$ of oxygen would be necessary.

Various alternative processes may be used in order to produce the conductor tracks:

EXAMPLE 2

("Lift-off" Process):
1. Coating a perforated KAPTON E film with liquid photoresist, exposure, development in 1t by weight $Na_2CO_3$ solution,
2. Pre-treatment by means of glow discharge:
   Gas: oxygen
   Pressure: 25 Pa,
   Gas Flow: 100 standard-$cm^3$/min
   Power Density: 0.8W/$cm^2$
   Treatment Time: 90 seconds
3. Pre-deposition by means of glow discharge:
   Organometallic compound: π-allyl-π-cyclopentadienyl-palladium-(II),
   Gas: Ar/$O_2$ or $N_2$/$O_2$ respectively in a mixture of 3:1,
   Pressure: 10 Pa
   Gas flow: 25 standard-$cm^3$/min
   Power Density: 0.5W/$cm^2$
   Evaporator Temperature: 45° C.
   Treatment Time: 10–15 minutes
4. If necessary, electroless deposition of palladium in a bath with formic acid as the reducing agent:
   Temperature: 70° C.
   pH value: 6.0
   Treatment Time: 5–8 minutes
5. Removal of photo-mask in acetone.
6. Build-up of conductor track with electroless palladium deposition as process step 4 until required layer thickness is achieved.

The advantage of this procedure resides in the fact that at the points at which no conductor tracks are formed, only the metal used to produce the perforated mask is applied and later removed again. At these points however no metal coating used for producing conductor tracks is deposited by decomposition of the volatile metal compounds in the glow discharge. Therefore no metal contaminations can form on the substrate surface at these points, so that the insulation resistance between the conductor tracks is particularly high.

The basic metal coatings on the photo-masking areas are selected to be so thin, for example 0.1 Am, that their removal together with the photo-mask lying thereunder is easily performed i.e. without individual points of the polymer films remaining behind on the substrate surfaces. Conventional chemical solutions are used for removing the polymer films.

EXAMPLE 3

(Fully Additive Technique):
1. Pre-treatment of a perforated UPILEX S film in the glow discharge:
   Gas: oxygen
   Pressure: 25 Pa
   Gas flow: 100 standard-$cm^3$/min
   Power Density: 0.8W/$cm^2$
   Treatment Time: 90 seconds
2. Pd deposition in glow discharge:
   Organometallic compound: π-allyl-π-cyclopentadienyl-palladium-(II),
   Gas: Ar/$O_2$ or $N_2$/$O_2$, respectively in a mixture of 3:1
   Pressure: 10 Pa
   Gas Flow: 25 standard-$cm^3$/min
   Power Density: 0.5 W/$cm^2$
   Evaporator Temperature: 45° C.
   Treatment Time: 10–15 minutes
3. Coating of the film with dry film resist, exposure, development in 1% by weight of $Na_2CO$, solution.
4. Fully-additive electroless deposition in the resist channel of palladium in a bath with formic acid as a reducing agent:
   Temperature: 70° C.
   pH value: 6.0
   Treatment time depending on layer thickness required.
5. Removal of dry film resist in acetone.
6. Palladium differential etching with diluted $HNO_3$/HCl solution.

Should the basic metal coating already exhibit sufficient conductivity, the second metal coating may be applied electrolytically in the resist channel.

EXAMPLE 4

(Subtractive Technique/Panel-Plating)
1. Pre-treatment of a perforated KAPTON H film by means of glow discharge:
   Gas: oxygen
   Pressure: 25 Pa
   Gas Flow: 100 standard-$cm^3$/min
   Power Density: 0.6 W/$cm^2$
   Treatment Time: 90 seconds 2. Pd deposition by means of glow discharge:
   Organometallic compound: π-allyl-π-cyclopentadienyl-palladium-(II),
   Gas: $Ar/O_2$ or $N_2/O_2$, respectively in a mixture of 3:1
   Pressure: 10 Pa
   Gas Flow: 25 standard-$cm^3$/min
   Power Density: 0.5 W/$cm^2$
   Evaporator Temperature: 45° C.
   Treatment Time: 10–15 minutes
3. Deposition of nickel/boron from a weakly acidic bath in an electroless manner, with dimethylaminoborane as a reducing agent:
   Temperature: 40° C.
   Treatment Time: 2 minutes
4. Electrolytic deposition of copper in a sulphuric acid copper bath:
   Cupracid BL (Company Atotech Deutschland GmbH, Berlin, Germany)
   Current Density: 2/$Adm^2$
   11 Layer Thickness: 254 m
5. Coating of film with dry film resist, exposure, development in 1% by weight $Na_2CO_3$ solution.
6. Etching off of copper and nickel/boron layer.
   Etching solution: $CuCl_2$/HCl with 120 g/l Cu in all, 1.5% by weight HCl, NaCl saturated 40° C.
7. Etching off palladium layer
   Etching solution one part $HNO_3$ concentrated; 3 parts HCl concentrated; 4 parts water
   Ambient Temperature
   Treatment time: 15 seconds
8. Removal of dry film resist in acetone.

EXAMPLE 5
(Semi-Additive Technique/Pattern Plating with Nickel/Boron or Copper Layer as Second Metallic Coating):
1. Pre-treatment of a perforated polyimide plate by means of glow discharge:
   Gas: oxygen
   Pressure: 25 Pa
   Gas Flow: 100 standard-$cm^3$/min
   Power Density: 0.8 W/$cm^2$
   Treatment Time: 90 seconds
2. Pd deposition by means of glow discharge:
   Organometallic compound π-allyl-π-cyclopentadienyl-palladium-(II),
   Gas: $Ar/O_2$ or $N_2/O_2$ respectively in a mixture of 3: 1
   Pressure: 10 Pa
   Gas Flow: 25 standard-$cm^3$/min
   Power Density: 0.5 W/$cm^2$
   Evaporator Temperature: 45° C.
   Treatment Time: 10–15 minutes
3. Electroless deposition of nickel/boron from a bath with dimethylaminoborane as a reducing agent:
   Temperature: 40° C.
   Treatment Time: 2 minutes
   Alternatively: deposition of copper from a weakly acidic or neutral electroless copper bath with hypophosphite as reducing agent.
4. Coating of the film with dry film resist, exposure, development in 1% by weight $Na_2CO_3$ solution.
5. Build-up of conductor track by means of electrolytic copper deposition (layer thickness 25 μm).
6. Metal resist layer deposited (for example tin).
7. Etching off of copper or nickel/boron layer:
   Etching solution: $CuCl_2$/HCl with 120 g/l Cu in all, 1.5% by weight HCl, NaCl saturated, 40° C.
8. Etching off palladium layer
   Etching solution one part HNO, concentrated; 3 parts HCl concentrated; 4 parts water.
   Ambient Temperature
   Treatment time: 15 seconds
9. Removal of dry film resist in acetone.

If instead of the oxidising gas mixture in the preceding example in process steps 2, respectively only inert gas mixtures without oxygen are used, for example pure nitrogen or pure argon, carbon-containing palladium layers result from deposition by glow discharge, yet with a smaller yield with respect to the organometallic compound used. In addition, the layers reveal a reduced catalytic activity and the security of adhesion to the substrate surface is not sufficiently resistant to the alkaline process steps.

In examples 2 to 5 securely-adhering metal coatings are obtained without exception which retain their secure adhesion to the polyimide surface even after a thermal treatment, for example a soldering process, or after or during a treatment with aqueous-alkaline solutions such for example as a developer or strip solution for a photoresist film.

The secure adhesion of the metal coatings on the substrate surface is in particular increased by heat treatment after deposition of the metal coatings which are deposited in an electroless and electrolytic manner (for example annealing at 120° C.).

If on the other hand, for example in example 5 (semi-additive technique/pattern-plating), instead of the acidic electroless copper bath an alkaline electroless copper bath is used, then in fact after deposition and annealing treatment at 150° C. securely adhering copper layers are obtained on the polyimide film. The secure adhesion however drops to very low values (for example of from 1.2 N/mm to 0.4 N/mm in the peel test) if the polyimide foil provided with the copper structures is dipped in an aqueous-alkaline developing solution.

In the abovenamed examples, another rare gas, for example neon, may be used instead of argon, the same test results being obtained.

Polyimide films with conductor tracks in the form of films, and manufactured according to the process in the invention, can be glued together to form stacks in a suitable process. A double-sided or four-layer circuit can be glued or laminated on to an optionally rigid carrier, for example a ceramic or FR4 plate (for example also a printed circuit board) or a silicon carrier. Two, four or more multi-layer circuits produced according to the method in the invention can be glued one on the other using an uncoated polyimide intermediate layer, and the intermediate product can if necessary be mechanically drilled and through-contacted in a wet-chemical manner in a previously known way. The conductor tracks in the individual conductor track planes are then, after drilling of holes through the stack, electrically interconnected in a previously known way by electroless metallization of the aperture walls.

What is claimed is:
1. Process for depositing metal coatings on polyimide surfaces, the metal coatings adhering to the polyimide surface and being resistant to aqueous alkaline solutions, the process consisting essentially of the steps of:
   a) deposition of a first metal coating on the polyimide surfaces by decomposition of volatile metal compounds by means of a glow discharge process in the presence of a gas mixture containing inert gases and oxygen, the inert gases and oxygen each having a respective partial pressure, the oxygen content being effective to provide a first metal coating catalytically active for subsequent electroless deposition of a second metal coating on a polyimide surface coated with the first metal coating; the ratio of partial pressure of the oxygen-containing compounds to that of the inert gases in the gas mixture being set to a value between 2:1 and 1:8;

b) electroless deposition of a second pure metal coating on the first metal coating from an acidic or neutral metallizing bath, the bath having a pH.

2. Process according to claim 1, characterized in that inert gases are selected from the group consisting of rare gases and nitrogen.

3. Process according to claim 1, characterized in that the ratio of partial pressure of the oxygen-containing compounds to that of the inert gases in the gas mixture is set to a value between 2:1 and 1:8.

4. Process according to claim 1, characterized in that the partial pressure of the gas mixture is set to a value between 1 Pa and 50 Pa.

5. Process according to claim 1, characterized in that palladium compounds are used as volatile metal compounds.

6. Process according to claim 1, characterized in that the first metal coating is deposited at a thickness of from 0.01 µm and 0.1 µm.

7. Process according to claim 1, characterized in that the pH value of the metallizing bath for electroless deposition is set between 2 and 8.

8. Process according to claim 1, characterized in that, for electroless metallization, a bath selected from the group consisting of nickel, copper, cobalt, palladium and alloy baths of these metals is used.

9. Process according to claim 1, characterized in that a layer selected from the group consisting of a nickel/boron alloy layers a nickel/phosphorous alloy layer with a phosphorous content of between 3 and 5% by weight of phosphorous, and a palladium layers is deposited by an electroless method as the second metal coating layer.

10. Process for manufacturing an electrical base circuit, comprising a polyimide-substrate, conductor tracks having conductor track widths and spacings substantially below 100 µm and with holes with diameters substantially below 100 µm, the process consisting essentially of the steps of:

application of a metal coating to at least one substrate surface, structuring of the metal coating by means of photomasking, etching of the holes in the substrate by means of vacuum etching, removal of the metal coating, pre-treatment of the surfaces and the walls of the holes by means of a glow discharge process with an oxidizing gas mixture containing an oxygen-containing compound, deposition of metal coatings according to any of claims 1–9, and structuring of individual metal coatings by means of photo-masking.

* * * * *